United States Patent [19]
Ananth et al.

[11] Patent Number: 5,679,953
[45] Date of Patent: Oct. 21, 1997

[54] AUTOMATIC THRESHOLD SETTING CIRCUIT

[75] Inventors: Ravi Shanker Ananth, Ancaster, Canada; Sudhir Muniswamy Gowda, Ossining, N.Y.; Mark Samson Milshtein, Hillsboro, Oreg.; Mark B. Ritter, Danbury, Conn.; Dennis Lee Rogers, Croton-on-Hudson, N.Y.

[73] Assignee: International Business Machines Corporation, Armonk, N.Y.

[21] Appl. No.: 695,819

[22] Filed: Aug. 5, 1996

[51] Int. Cl.$^6$ ............................................. G01J 5/06
[52] U.S. Cl. ........................... 250/338.1; 250/252.1
[58] Field of Search ................ 250/252.1 A, 338.1, 250/338.4, 370.01

[56] References Cited

U.S. PATENT DOCUMENTS

| | | | |
|---|---|---|---|
| 3,787,668 | 1/1974 | Currie et al. | 250/338.1 X |
| 4,426,662 | 1/1984 | Skerlos et al. | 348/734 |
| 4,933,563 | 6/1990 | Thus | 250/338.4 X |

*Primary Examiner*—Edward J. Glick
*Attorney, Agent, or Firm*—Whitham, Curtis, Whitham & McGinn; Robert P. Tassinari, Jr.

[57] ABSTRACT

An automatic and adaptive threshold setting circuit for an IR receiver is capable of operating over a broad range of frequencies and power levels. The adaptive threshold circuit allows a very sensitive threshold in environments where little sunlight or other ambient light reaches the receiver, but which will increase the threshold of the receiver when large amounts of ambient light fall on the photo diode. The circuit senses the current flowing through the reverse biased IR photo detector due to ambient light levels. This current measurement is used to adjust the sensitivity of the receiver.

11 Claims, 4 Drawing Sheets

1

AUTOMATIC THRESHOLD SETTING CIRCUIT

BACKGROUND OF THE INVENTION

1. Field of the Invention

The present invention is a circuit which is used to adjust the threshold of an infrared wireless receiver based on the average current flowing through the photodiode (or other photo detection device).

2. Background Description

The current Infrared Data Association (IrDA) standard requires a high sensitivity receiver with a reasonably large bandwidth and so are susceptible to shot noise generated by current flow in the photodiode. Recently proposed faster wireless applications require even greater receiver bandwidth, making the problem even more severe. The problem is quite easily understood: the receiver will trigger on this shot noise for sufficiently bright sunlight or other moderate to bright light with spectral components in the infrared. This problem is severe because of the protocol of the IrDA: if any pulses come from the receiver, the upper layer protocol will assume that someone else is talking in the room (but not to them because they cannot understand it) and the transceiver so confused by ambient sunlight (or desk lamps) will never talk to anything. For an example, we have measured the performance of one major vendor's circuit: when it is a meter from a 60 Watt light bulb, the output of the receiver is dominated by shot noise. Because of this sensitivity to ambient or background light, many consumers may be unhappy with infrared (IR) wireless performance. If one simply increases the decision threshold in the receiver, then more signal will be required to send data and the signal to noise ratio (SNR) will improve but then, since more light is required and the light emitting diode (LED) output is near the eye safe limit already, the range of the link will necessarily decrease to provide this noise immunity. This is the problem and dilemma.

SUMMARY OF THE INVENTION

It is therefore an object of the present invention to provide an automatic threshold setting circuit for an IR receiver which is capable of operating over a broad range of frequencies and power levels.

According to the invention, there is provided an adaptive threshold circuit which will allow a very sensitive threshold in environments where little sunlight or other ambient light reaches the receiver, but which will increase the threshold of the receiver when large amounts of ambient light fall on the photodiode. The circuit senses the current flowing through the reverse biased IR photo detector due to ambient light levels. This current measurement is used to adjust the sensitivity of the receiver.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
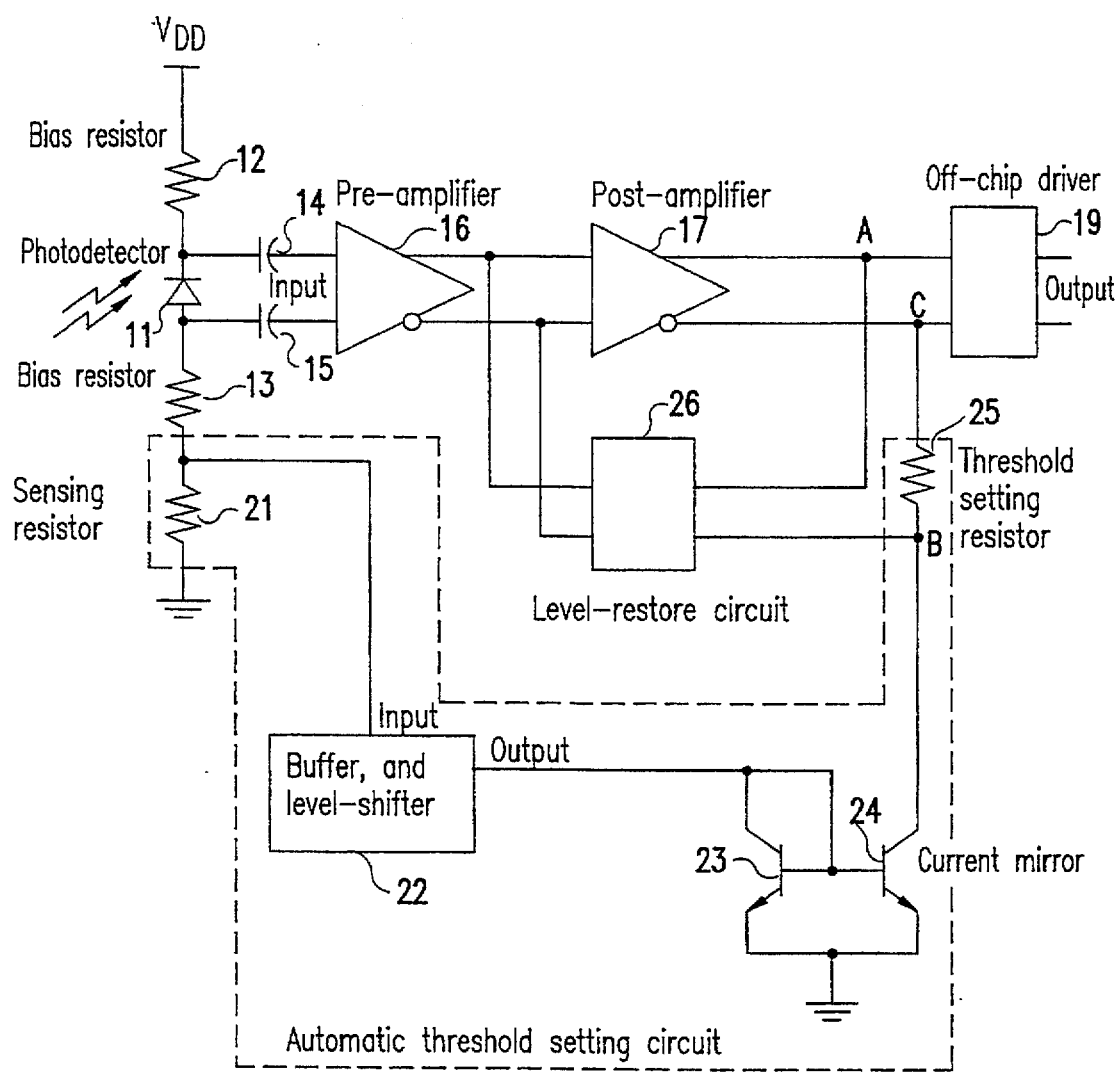
FIG. 1 is a schematic diagram showing a first embodiment of the automatic threshold setting circuit according to the preferred embodiment of the invention.

Referring now to the drawings, and more particularly to FIG. 1, there is shown the general form of the automatic threshold setting circuit according to the invention. An infrared (IR) photo detector 11 is connected between and in series with a pair of bias resistors 12 and 13. Photo detector 11 is reverse biased, and any current which flows through detector 11 (aside from the tiny leakage or dark current) is due to photo-induced carriers being swept across the reverse-biased PN junction. Bias resistor 12 is connected to a voltage source $V_{DD}$ and provides a bias level to the photo detector 11. Input capacitors 14 and 15 connected to either side of the IR photo detector 11 provide an alternating current (AC) coupling input to a differential preamplifier 16, passing only high frequency signals to the preamplifier 16. The size of the capacitors 14 and 15 is a matter of design choice, depending on the frequency of the signals that one wishes to have amplified.

One problem solved by the invention is how to deal with a large amount of DC light signal generated by high intensity light sensed at the photo detector 11. This noise is disposed of by means of the capacitors 14 and 15, which block the DC signal. High intensity light also produces high frequency noise that can be coupled through the capacitors 14 and 15.

The output of preamplifier 16 is directly connected to the input of a differential post amplifier 17. The output of the post amplifier 17 is connected to an off-chip driver 19 which provides an output signal to processing circuitry. The gain of the circuit in the preferred embodiment is on the order of seven million. This is because the level of some input signals can be as low as 150 nAmps. This current can also be as high as ten milliAmps. Thus, it can be seen that there is an extremely broad range of signal strengths. High amplitude input noise can severely degrade the signal after amplification. Because of the extremely low amplitude signals that must be measured, an automatic thresholding circuit in accordance with the invention must be provided to allow detection of data signals across a broad range of amplitudes.

The current flowing in photodiode 11 can be sensed, either by the voltage generated across a resistor or by the control voltage applied by active biasing circuitry. Either the direct current (DC) itself or a voltage proportional to the current flow can then be used to increase the threshold at the comparator (after the active gain stages). In the embodiment shown in FIG. 1, a sensing resister 21 is connected in series between bias resistor 13 and circuit ground. This is the sensing element for the automatic threshold setting circuit, and the current flowing through resistor 21 is a function of the ambient light on the photo detector 11. The voltage drop across resistor 21 is input to buffer and level-shifter 22. The output of buffer and level-shifter 22 is input to a current mirror comprising a pair of NPN bipolar transistors 23 and 24 having common base and emitter connections. The output of buffer and level-shifter 22 is connected to the collector of transistor 23 and to the common base connection of transistors 23 and 24. The collector of transistor 24, denoted node B, is connected in series with threshold setting resistor 25 which is connected to the negative output of post amplifier 17, denoted node C.

The current mirror operates as a variable impedance controlled by the buffer and level-shifter 22. The lower the ambient light striking photo detector 11, the less current will flow in sensing resistor 21, and visa versa. For low ambient light levels, the conduction of transistor 24 is decreased so that there is less current flowing through resistor 25.

Finally, a level restore circuit 26, having one input connected to the positive output of amplifier 17, denoted as node A, and the other input connected to node B, is connected across the input of post amplifier 17. The threshold is set by sensing the voltage level at the output of post amplifier 17 by drawing a current through resistor 25 and generating a voltage at node B. The outputs of the amplifier 17 are applied to the level restore circuit 26 which ensures that the voltage at nodes A and B are equal. Thus, the voltage at node C will always be positively offset from the level at node A. The amount by which node C is offset from node A is the threshold. Thus, if the threshold is larger than any noise, the noise will not appear at the output of the off chip driver 19.

Figure 2:
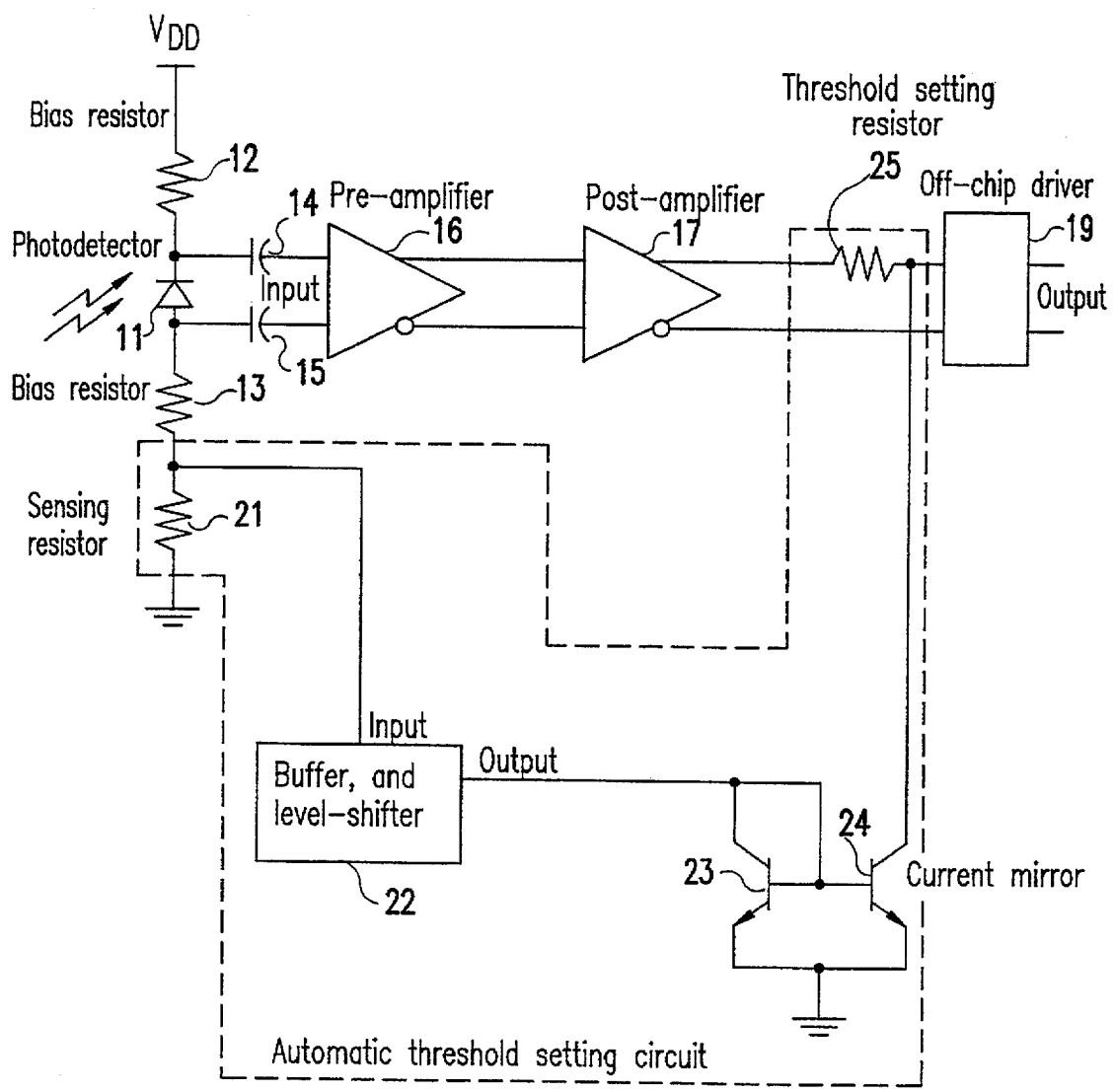
FIG. 2 is a schematic diagram showing a second embodiment of the automatic threshold setting circuit according to the preferred embodiment of the invention.

The embodiment shown in FIG. 1 can be simplified as shown in the second embodiment of FIG. 2 in which like reference numerals denote like or corresponding elements. In this second embodiment, the level restore circuit 26 is omitted, and the threshold setting resistor 25 is moved to be in series with the positive output of the post amplifier 17 and the off chip driver 19. The collector of NPN transistor 24 of the current mirror is connected to the junction between threshold setting resistor 25 and off chip driver 19. Thus, depending on the conduction of transistor 24, the signal output to off chip driver 19 will be adjusted according to the threshold.

Figure 3:
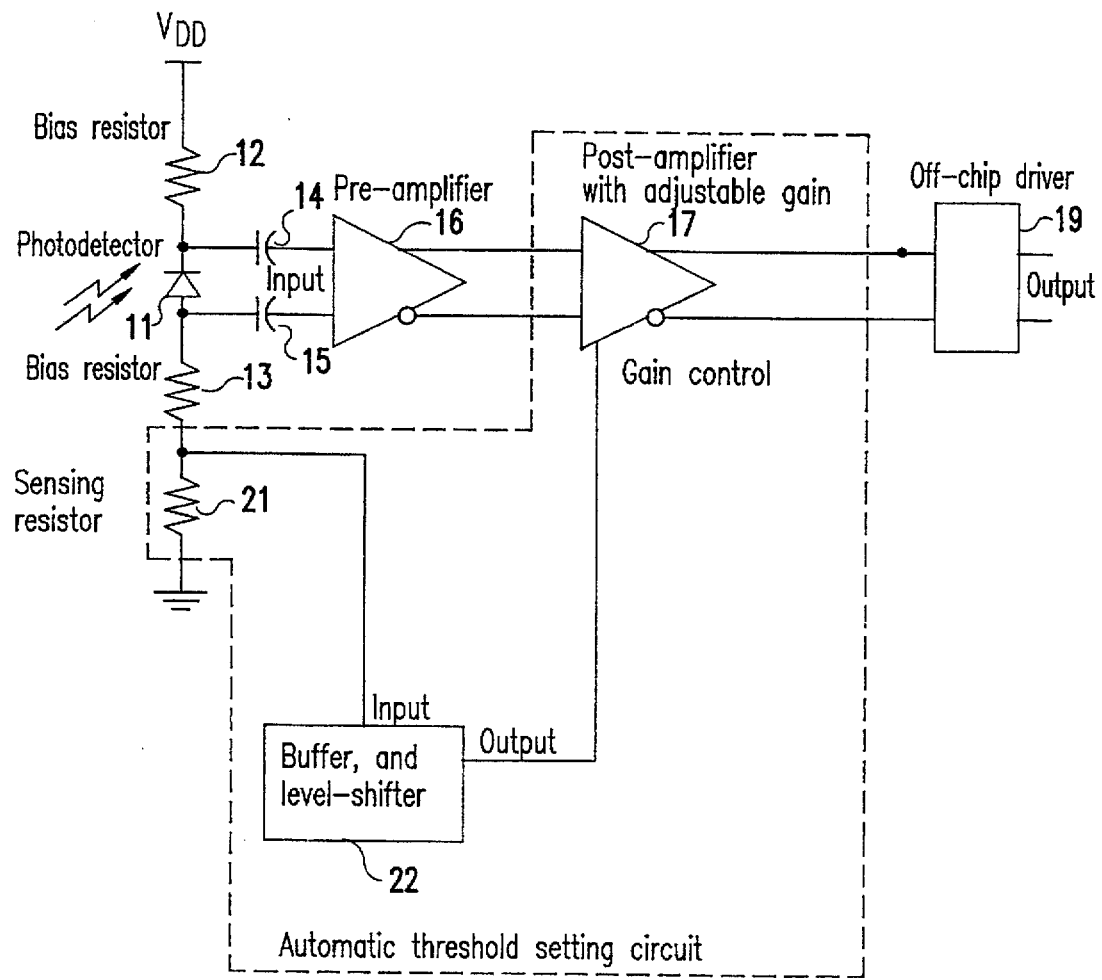
FIG. 3 is a schematic diagram showing a third embodiment of the automatic threshold setting circuit according to the preferred embodiment of the invention.

In the third embodiment, the signal from sensing resistor 21 is used to decrease the gain of one of the gain stages (which will effectively do the same thing as changing the threshold). The third embodiment is shown in FIG. 3 where, again, like reference numerals represent like or corresponding elements. In this third embodiment, the post amplifier 17 is an amplifier with adjustable gain control. This makes possible the elimination of the current mirror and the threshold setting resistor used in the first and second embodiments. The output of the buffer and level shifter 22 is directly connected to the gain control input of post amplifier 17. In this embodiment, the threshold of the circuit is fixed, but the gain is changed in order to vary the input signal level that can be received by the circuit. The light level is still sensed by the sensing resistor 21. When the signal level (and hence shot noise) is high, the gain control signal reduces the gain of the post amplifier 17. This reduces the sensitivity of the circuit to noise due to ambient light, while sacrificing signal sensitivity.

Figure 4:
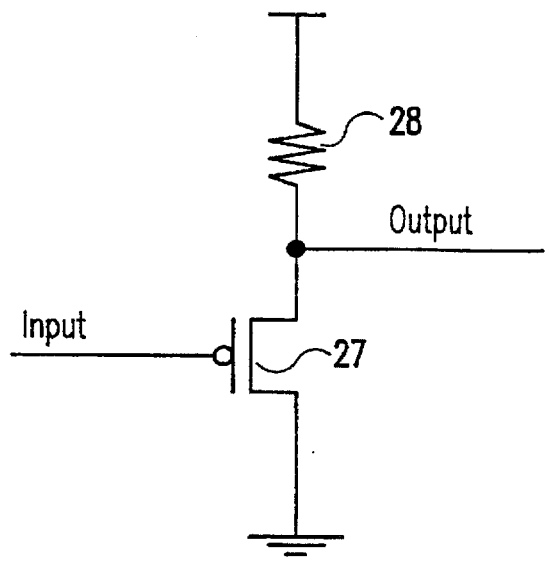
FIG. 4 is a schematic diagram of one implementation of the buffer and level shifter circuit used in the automatic threshold setting circuits shown in FIGS. 1, 2 and 3.

There are several possible implementations of the buffer/level-shift circuit block 22. A preferred implementation is shown in FIG. 4. This circuit comprises a P-type field effect transistor (PFET) 27 having a drain connected to circuit ground and a source connected in series with bias resistor 28 to voltage source $V_{DD}$. The input to the circuit is connected to the gate of PFET 27, and the output is taken from the junction of the source and resistor 28. The circuit performs three main functions: First, it provides a high input impedance in order to provide minimal load on the photo detector bias circuit. Second, it provides low input capacitance in order to minimize loss of signal between the photo detector and input of the receiver. Third, the output of the circuit is at higher voltage level to enable following current mirror stage(s) to operate in desired mode.

Figure 5:
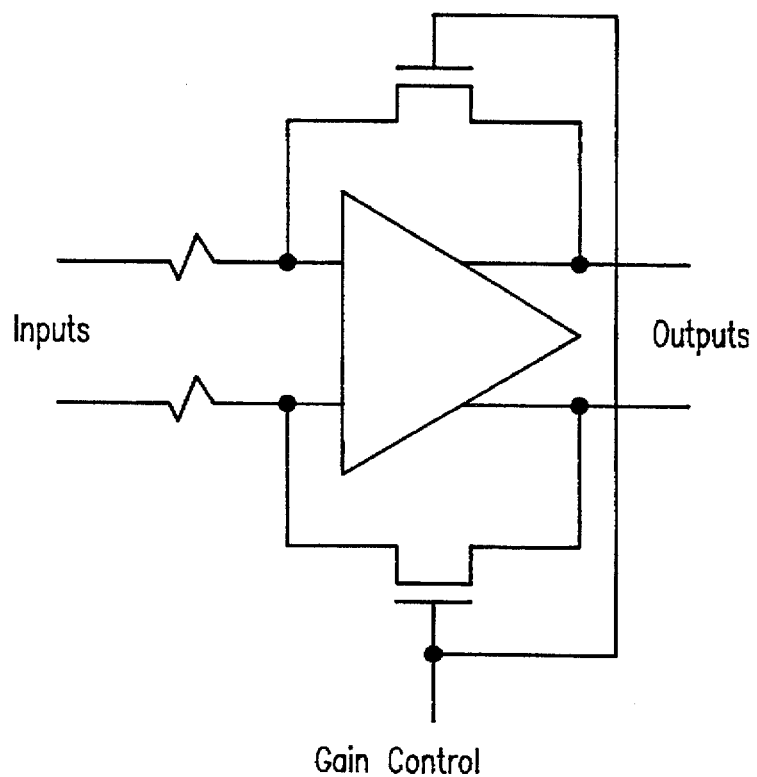
FIG. 5 is a schematic diagram of one implementation of the post amplifier with adjustable gain circuit used in the automatic threshold setting circuit shown in FIG. 3.

FIG. 5 shows an implementation of the post amplifier 17 with adjustable gain control. This circuit consists of a basic amplifier stage with field effect transistors (FETs) 31 and 32 connected in feedback paths from outputs to inputs. The gain control signal from the buffer and level shifter 22 is applied to the gates of FETs 31 and 32. By varying the gate voltage of the FETs 31 and 32, the feedback impedance can be changed, thus changing the gain of the circuit.

There are several other ways of implementing a variable gain amplifier including using the gain control voltage to vary the bias current of the basic amplifier stage. Thus, those skilled in the art will understand that the practice of the invention is not limited to any specific gain control circuit. Moreover, while the several embodiments of the invention have been implemented using differential amplifiers, those skilled in the art will recognize that equivalent implementations can be made using single-ended amplifiers. Regardless of how the invention is actually implemented, an IR receiver incorporating the invention will have a high sensitivity to transmitted signals in the dark, a lower sensitivity in direct sunlight (say), and will not have a noisy output even in bright sunlight or incandescent light. In this way the receiver adapts to the ambient lighting environment and provides the best sensitivity given the amount of ambient light reaching the photo detector.

While the invention has been described in terms of three preferred embodiments, those skilled in the art will recognize that the invention can be practiced with modification within the spirit and scope of the appended claims.

Having thus described our invention, what we claim as new and desire to secure by Letters Patent is as follows:

1. An automatic threshold setting circuit for an infrared receiver comprising:

a sensing resistor for measuring a direct current flowing through a reverse biased infrared photo detector due to ambient light;

a level shifter responsive to the measured direct current flowing through the reverse biased infrared photo detector for generating a control signal; and threshold means responsive to said control signal for controlling a gain of an amplification stage connected to amplify an alternating current signal from the reverse biased infrared photo detector.

2. The automatic threshold setting circuit for an infrared receiver recited in claim 1 wherein said threshold means comprises:

a threshold setting resistor connected to an output of the amplification stage for the reverse biased infrared photo detector; and means responsive to the control signal for controlling a current flowing through the threshold setting resistor.

3. The automatic threshold setting circuit for an infrared receiver recited in claim 2 wherein said means responsive to the control signal is a current mirror.

4. The automatic threshold setting circuit for an infrared receiver recited in claim 3 further comprising means connected to the threshold setting resistor for controlling the gain of said amplification stage.

5. The automatic threshold setting circuit for an infrared receiver recited in claim 1 wherein the threshold means responsive to said control signal is an adjustable gain control for said amplification stage.

6. The automatic threshold setting circuit for an infrared receiver recited in claim 5 wherein said adjustable gain control comprises a field effect transistor connected in a feedback path of said amplification stage, said field effect transistor having a gate connected to receive said control signal.

7. The automatic threshold setting circuit for an infrared receiver recited in claim 1 wherein said level shifter comprises a field effect transistor having a gate connected to said sensing resistor and generating said control signal.

8. An infrared receiver comprising:
- a reverse biased infrared photo detector;
- an amplification stage for the reverse biased infrared photo detector;
- a sensing resistor for measuring a direct current flowing through the reverse biased infrared photo detector due to ambient light;
- a threshold setting resistor connected to an output of the amplification stage for the reverse biased infrared photo detector; and
- threshold means responsive to the measured direct current flowing through the reverse biased infrared photo detector for controlling a current flowing through the threshold setting resistor.

9. The infrared receiver recited in claim 8 further comprising means connected to the threshold setting resistor for controlling a gain of said amplification stage.

10. The infrared receiver recited in claim 8 wherein said threshold means comprises:
- level shifter responsive to the measured direct current flowing through the reverse biased photo detector for generating a control signal; and
- a current mirror responsive to said control signal for controlling the current flowing through the threshold setting resistor.

11. The infrared receiver recited in claim 10 further comprising means connected to the threshold setting resistor for controlling a gain of said amplification stage.

\* \* \* \* \*